(12) United States Patent
Shih

(10) Patent No.: US 11,239,217 B2
(45) Date of Patent: Feb. 1, 2022

(54) SEMICONDUCTOR PACKAGE INCLUDING A FIRST SUB-PACKAGE STACKED ATOP A SECOND SUB-PACKAGE

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/833,690

(22) Filed: Mar. 30, 2020

(65) Prior Publication Data

US 2021/0305223 A1    Sep. 30, 2021

(51) Int. Cl.
*H01L 25/10*  (2006.01)
*H01L 23/48*  (2006.01)
(Continued)

(52) U.S. Cl.
CPC .......... *H01L 25/105* (2013.01); *H01L 21/561* (2013.01); *H01L 21/565* (2013.01); *H01L 21/568* (2013.01); *H01L 21/76898* (2013.01); *H01L 23/481* (2013.01); *H01L 24/14* (2013.01); *H01L 24/96* (2013.01); *H01L 25/50* (2013.01); *H01L 2224/14104* (2013.01); *H01L 2224/14517* (2013.01); *H01L 2224/95001* (2013.01); *H01L 2225/1041* (2013.01); *H01L 2225/1058* (2013.01); *H01L 2924/35121* (2013.01)

(58) Field of Classification Search
CPC ............. H01L 21/565; H01L 21/76898; H01L 23/481; H01L 23/5226; H01L 2224/14517; H01L 2224/13009; H01L 2224/02372; H01L 2224/05009; H01L 2224/05025; H01L 2224/05087; H01L 2224/0509; H01L 2224/0557; H01L 2224/08146; H01L 2224/13025; H01L 2224/16146; H01L 2225/1058; H01L 2225/06541; H01L 25/074; H01L 25/0657; H01L 25/0756; H01L 25/043; H01L 25/117; H01L 25/105; H01L 2224/023; H01L 2224/0231; H01L 2224/0233; H01L 2224/14104; H01L 2224/95001; H01L 21/561; H01L 21/568; H01L 24/14; H01L 24/96
USPC ......................................................... 257/686
See application file for complete search history.

(56) References Cited

U.S. PATENT DOCUMENTS 8,993,377 B2 * 3/2015 Koo .................. H01L 24/06
                                                              438/107
9,059,053 B2 * 6/2015 Liang ............... H01L 25/0657
(Continued)

FOREIGN PATENT DOCUMENTS

| TW | 201614781 A | 4/2016 |
| TW | 202010085 A | 3/2020 |
| TW | 202011558 A | 3/2020 |

*Primary Examiner* — Khiem D Nguyen
(74) *Attorney, Agent, or Firm* — CKC & Partners Co., LLC

(57) ABSTRACT

A semiconductor package includes a first sub-package and a second sub-package. The first sub-package is stacked atop the second sub-package. Each of the first sub-package and the second sub-package includes at least two first semiconductor dies, a second semiconductor die, a plurality of molding pieces, a bond-pad layer, a plurality of redistribution layers (RDLs) and a plurality of bumps. The bumps of the first sub-package are attached to the bond-pad layer of the second sub-package.

10 Claims, 7 Drawing Sheets

(51) Int. Cl.
*H01L 21/56* (2006.01)
*H01L 21/768* (2006.01)
*H01L 23/00* (2006.01)
*H01L 25/00* (2006.01)

(56) References Cited

U.S. PATENT DOCUMENTS

| | | | |
|---|---|---|---|
| 9,305,902 B1 * | 4/2016 | Lin | H01L 23/481 |
| 2011/0291288 A1 * | 12/2011 | Wu | H01L 24/11 |
| | | | 257/774 |
| 2015/0359098 A1 * | 12/2015 | Ock | H05K 3/303 |
| | | | 361/782 |
| 2017/0110419 A1 * | 4/2017 | Shih | H01L 23/585 |
| 2020/0075490 A1 * | 3/2020 | Sung | H01L 25/105 |
| 2020/0075542 A1 * | 3/2020 | Sung | H01L 23/5389 |

\* cited by examiner

SEMICONDUCTOR PACKAGE INCLUDING A FIRST SUB-PACKAGE STACKED ATOP A SECOND SUB-PACKAGE

BACKGROUND

Field of the Invention

The present disclosure relates to a semiconductor package, and more particularly, to a semiconductor package in which multiple chips are stacked.

Description of the Related Art

Semiconductor manufacturers aim to inexpensively manufacture miniaturized, multifunctional, and high-capacity semiconductor devices. A semiconductor package technology is one of the technologies that help achieving the various aims. Particularly, a semiconductor package in which multiple chips are stacked is suggested to achieve the above-described aims.

The semiconductor package generally includes multiple sub-packages in which one stack atop another. The mismatch in coefficient of thermal expansion between the different materials in the semiconductor package can generate high interfacial stresses due to thermal loading during fabrication and assembly. The interfacial stress may result in an interfacial delamination of surfaces between each of the sub-packages.

SUMMARY

According to one aspect of the present disclosure, a semiconductor package includes a first sub-package and a second sub-package. The first sub-package is stacked atop the second sub-package. Each of the first sub-package and the second sub-package includes at least two first semiconductor dies, a second semiconductor die, a plurality of molding pieces, a bond-pad layer and a plurality of redistribution layers (RDLs). The second semiconductor die is disposed in-between two first semiconductor dies. Each of the first semiconductor dies includes a plurality of through silicon vias (TSVs). The molding pieces are disposed between each of the first semiconductor dies and the second semiconductor die. Upper surfaces of the TSVs, upper surfaces of the molding pieces, upper surfaces of the first semiconductor dies and an upper surface of the second semiconductor die are coplanar. The bond-pad layer is disposed over the upper surfaces of the TSVs, the upper surfaces of the molding pieces, the upper surfaces of the first semiconductor dies and the upper surface of the second semiconductor die. The RDLs are disposed underneath lower surfaces of the TSVs, lower surfaces of the molding pieces, lower surfaces of the first semiconductor dies and a lower surface of the second semiconductor die. The bumps are connected to the RDLs. The bumps of the first sub-package are attached to the bond-pad layer of the second sub-package.

In some embodiments, the bond-pad layer of each of the first sub-package and the second sub-package includes active pads and dummy pads, each of the active pads is disposed on a corresponding one of the upper surfaces of TSVs and the dummy pads are disposed on the second semiconductor die.

In some embodiments, the bond-pad layer includes passivation material.

In some embodiments, the RDLs of each of the first sub-package and the second sub-package are electrically connecting to the TSVs.

In some embodiments, the RDLs are electrically connected between the each of first semiconductor dies and the second semiconductor die.

In some embodiments, the bumps of each of the first sub-package and the second sub-package include active bumps and dummy bumps, the active bumps are disposed below each of the first semiconductor dies and the dummy bumps are disposed below the second semiconductor die.

In some embodiments, from a top view, the dummy bumps are disposed at corners of the second semiconductor die.

In some embodiments, the active bumps of the first sub-package are attached to a corresponding one of the active pads of the second sub-package, and the dummy bumps of the first sub-package are attached to a corresponding one of the dummy pads of the second sub-package.

In some embodiments, the active bumps are electrically connected to the TSVs and the dummy bumps are free of electrically connecting to the TSVs.

In some embodiments, the bumps of each of the first sub-package and the second sub-package include active bumps, first dummy bumps, and second dummy bumps, the active bumps and the first dummy bumps are disposed below the first semiconductor dies and the second dummy bumps are disposed below the second semiconductor die.

In some embodiments, the active bumps are electrically connected to the TSVs, and both the first and the second dummy bumps are free of electrically connecting to the TSVs.

According to another one aspect of the present disclosure, a method of manufacturing a semiconductor package includes forming a first sub-package and a second sub-package, in which forming each of the first and the second sub-package includes following steps: (a) disposing at least two first semiconductor dies and a second semiconductor die disposed in between thereof on a first supporting substrate, in which each of the first semiconductor dies includes a plurality of through silicon vias (TSVs) substantially vertical to the first supporting substrate and each having a first end connecting to the first supporting substrate and a second end embedded in the first semiconductor die; (b) forming a molding layer covering the first supporting substrate, the first semiconductor dies and the second semiconductor die; (c) thinning the molding layer, the first semiconductor dies and the second semiconductor die, in which the second ends of the TSVs are exposed from the first semiconductor dies, in which upper surfaces of the TSVs, upper surfaces of the thinned molding layer, upper surfaces of the thinned first semiconductor dies and an upper surface of the thinned second semiconductor die are coplanar; (d) forming a bond-pad layer over the upper surfaces of the TSVs and the upper surface of the thinned second semiconductor die; (e) removing the first supporting substrate from lower surfaces of the TSVs, lower surfaces of the molding layer, lower surfaces of the first semiconductor dies and a lower surface of the second semiconductor die; and (f) forming a plurality of redistribution layers (RDLs) underneath the lower surfaces of the TSVs, the lower surfaces of the molding layer, the lower surfaces of the first semiconductor dies and the lower surface of the second semiconductor die; (g) forming a plurality of bumps connecting to the RDLs; and stacking the first sub-package atop the second sub-package by attaching the bumps of the first sub-package to the bond-pad layer of the second sub-package.

In some embodiments, the method further includes adhering a second supporting substrate to the bond-pad layer before step (e).

In some embodiments, the method further includes removing the second supporting substrate from the bond-pad layer after step (g).

In some embodiments, the bond-pad layer of each of the first sub-package and the second sub-package includes active pads and dummy pads, each of the active pads is disposed on a corresponding one of the upper surfaces of TSVs and dummy pads are disposed on the second semiconductor die.

In some embodiments, the RDLs of each of the first sub-package and the second sub-package are electrically connecting to the TSVs.

In some embodiments, the RDLs are electrically connected between each of the first semiconductor dies and the second semiconductor die.

In some embodiments, the bumps of each of the first sub-package and the second sub-package include active bumps and dummy bumps, the active pumps are disposed below each of the first semiconductor dies and dummy bumps are disposed below the second semiconductor die.

In some embodiments, the active bumps are electrically connected to the TSVs and the dummy bumps are free of electrically connecting to the TSVs.

In some embodiments, the active bumps of the first sub-package are attached to a corresponding one of the active pads of the second sub-package, and the dummy bumps of the first sub-package are attached to a corresponding one of the dummy pads of the second sub-package.

BRIEF DESCRIPTION OF THE DRAWINGS

In order to make the above and other objects, features, advantages, and embodiments of the present invention more comprehensible, the detailed description of the drawings is as follows.

DETAILED DESCRIPTION

In order to make the description of the present invention more detailed and complete, reference may be made to the accompanying drawings and various implementations or examples described below.

As used herein, the singular number includes the plural referent unless there are other clear references in the present disclosure. By referring to a specific reference such as "an embodiment", in at least one of the embodiments of the present invention, it represents a specific feature, structure, or characteristic. When the special reference appears, there is no need to refer to the same embodiment. Furthermore, in one or more embodiments, these special features, structures, or characteristics can be combined with each other as appropriate.

The present disclosure is proving a method of manufacturing a semiconductor package which is equipped with dummy bumps and dummy pads to reduce interfacial delamination of surfaces between each of the sub-packages.

Figure 1:
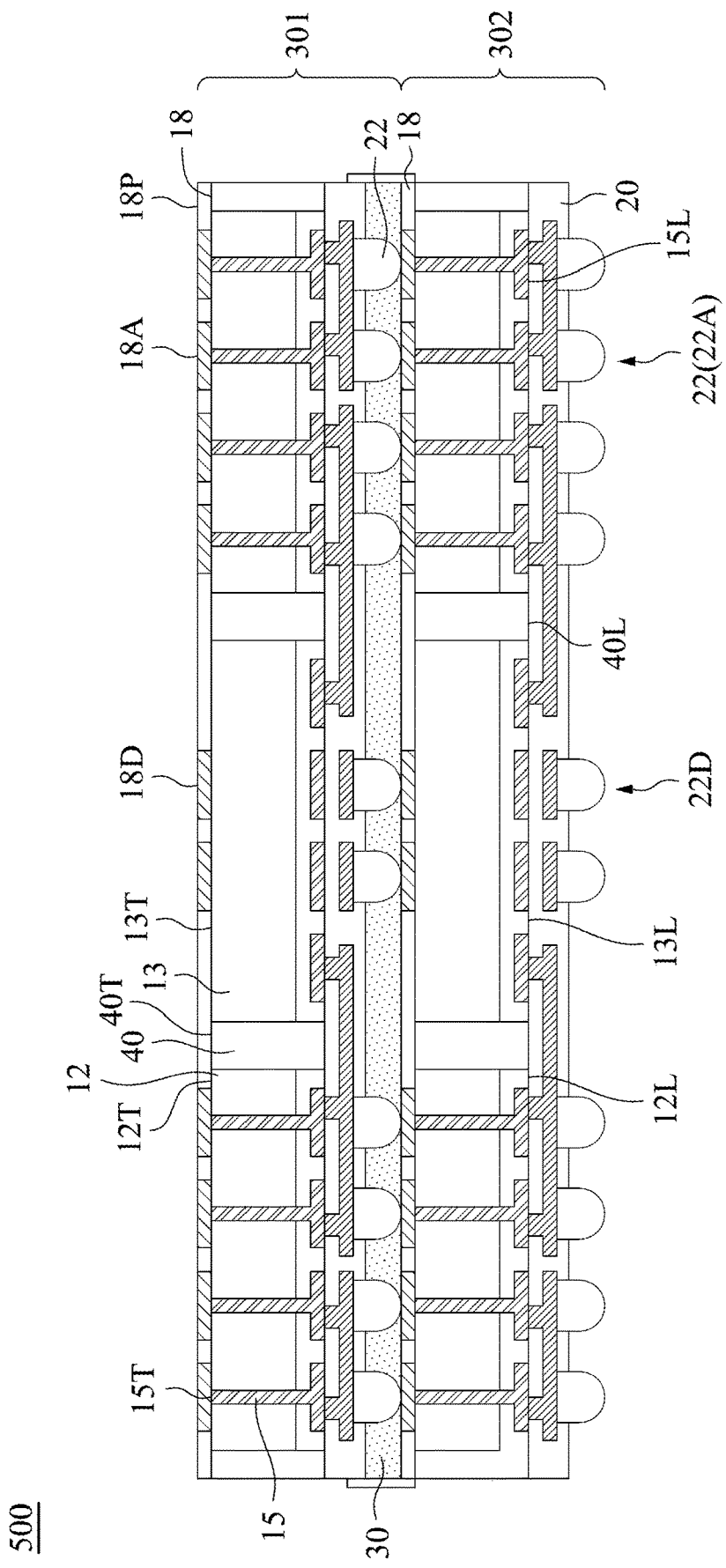
FIG. 1 illustrates a semiconductor package according to some embodiments of the present invention.

FIG. 1 illustrates a semiconductor package according to some embodiments of the present invention.

The semiconductor package 500 includes at least two sub-packages, for example, a first sub-package 301 and a second sub-package 302. The present disclosure providing a method of manufacturing the semiconductor package 500 includes forming a first sub-package 301 and a second sub-package 302 and then stacking the first sub-package 301 atop the second sub-package 302. The sub-method of manufacturing a first sub-package 301 or a second sub-package 302 of a semiconductor package will be described in more detail below.

Figure 2:
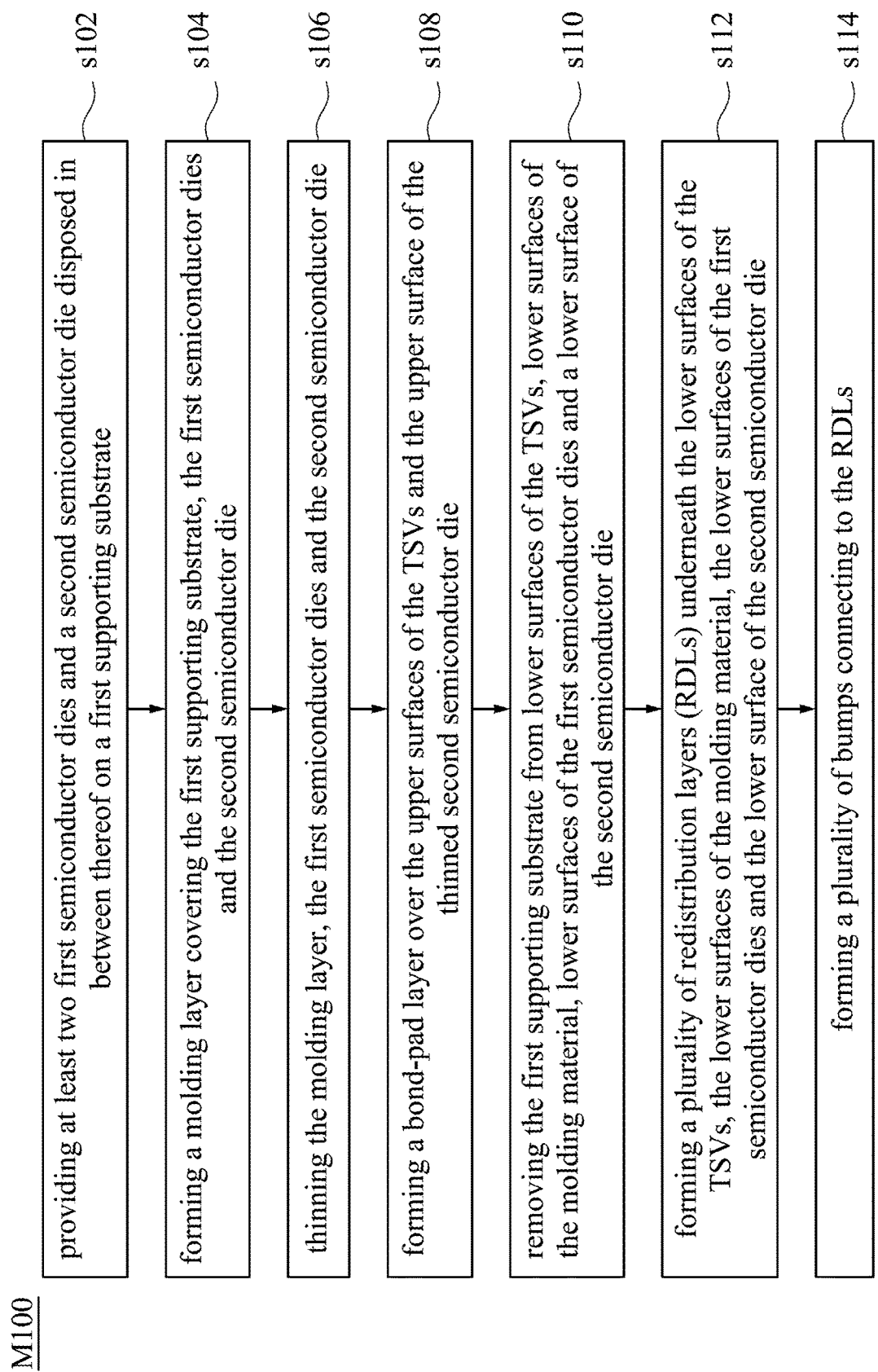
FIG. 2 is a flow chart of a sub-method M100 of manufacturing a first sub-package or a second sub-package of a semiconductor package in accordance with some embodiments of the present invention.

FIG. 2 is a flow chart of a sub-method M100 of manufacturing a first sub-package or a second sub-package of the semiconductor package 500 in FIG. 1 in accordance with some embodiments of the present invention. The sub-method M100 includes operation S102, S104, S106, S108, S110, S112 and S114 as shown in FIG. 2.

FIGS. 3-10 are cross-sectional views schematically illustrating various process stages in sub-method M100 according to some embodiments of the present invention.

Figure 3:
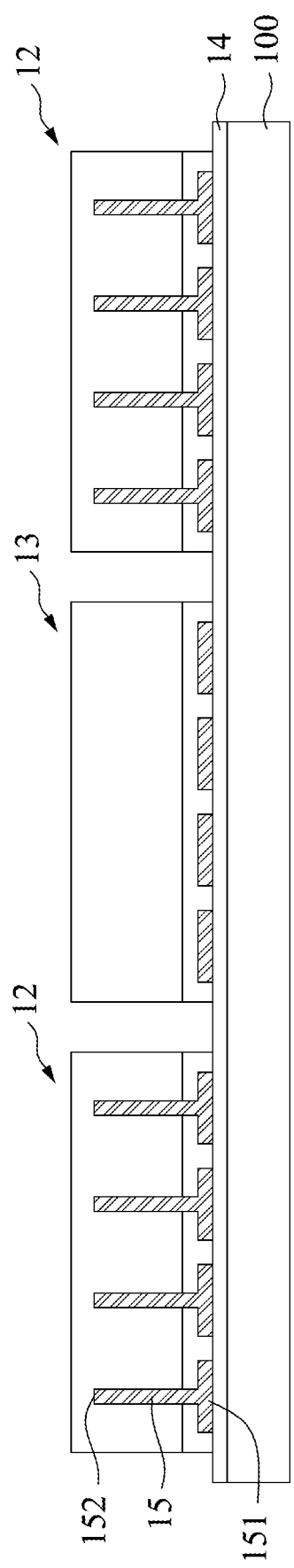
FIGS. 3-10 are cross-sectional views schematically illustrating various process stages in sub-method M100 according to some embodiments of the present invention.

Referring to operation S102, as shown in FIG. 3, at least two first semiconductor dies 12 and a second semiconductor die 13 are provided on a first supporting substrate 100. The second semiconductor die 13 is disposed in between the first semiconductor dies 12. More specifically, the active side of each of the first and second semiconductor dies 12 and 13 is mounted facedown toward the first supporting substrate 100.

In some embodiments, the first semiconductor die 12 includes memory circuit and the second semiconductor die 13 includes logic circuit. In other embodiments, the first semiconductor die 12 is substantially a memory die and the second semiconductor die 13 substantially a logic die.

Although the drawings illustrate a die set including two first semiconductor dies 12 and a second semiconductor die 13, the present invention is not limited to this. That is, two or more die sets can be arranged in matrix on the first supporting substrate 100.

In some embodiments, the first supporting substrate 100 is made with silicon, glass, composite material with proper coefficient of thermal expansion (CTE), or other materials capable of supporting processing temperatures in excess of 200° C. The first supporting substrate 100 is a temporary and sacrificial supporting wafer substrate.

In some embodiments, an adhesive layer 14 is formed between the first supporting substrate 100 and the dies. In other embodiment, the adhesive layer 14 is substantially a thermal release tape. In certain embodiment, the adhesive layer 14 is substantially an UV-release tape.

In some embodiments, each of the first semiconductor dies 12 includes a plurality of through silicon vias 15 (TSVs) substantially vertical to the first supporting substrate 100 and each having a first end 151 connecting to the first supporting substrate 100 and a second end 152 embedded in the first semiconductor die 12. In some embodiments, the TSVs 15 are made of copper, gold, silver, palladium or equivalents thereof, but their material need not be limited to these.

Figure 4:
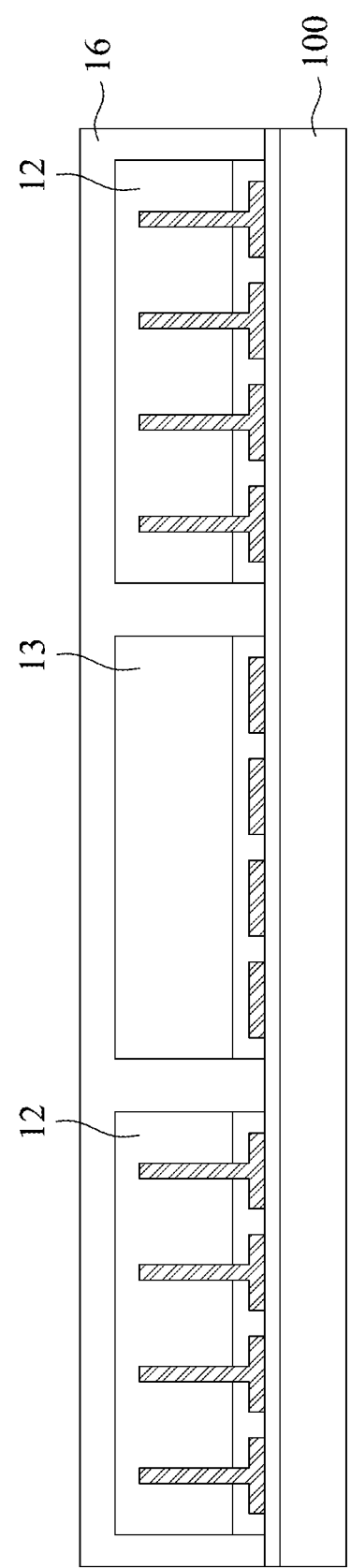

Referring to operation S104, as shown in FIG. 4, a molding layer 16 is formed and the molding layer 16 convers the first supporting substrate 100, the first semiconductor dies 12 and the second semiconductor die 13. In other words, each of the first semiconductor dies 12 and the second semiconductor die 13 is separated by the molding layer 16.

In some embodiments, the molding layer 16 is substantially made of an encapsulant or molding compound including epoxy or any suitable materials.

Figure 5:
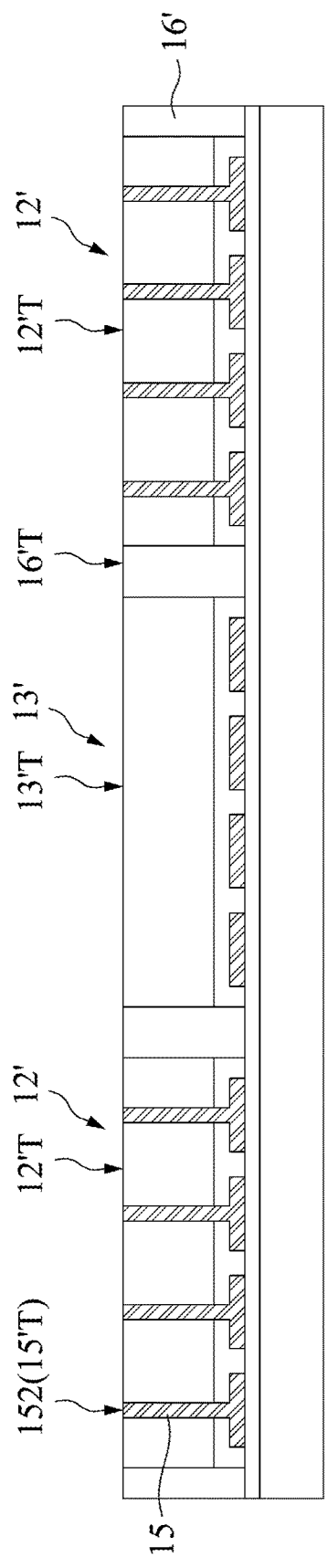

Referring to operation S106, as shown in FIG. 5, the molding layer 16, the first semiconductor dies 12 and the second semiconductor die 13 are thinned; thereby each of the second ends 152 of the TSVs 15 are exposed from the thinned first semiconductor dies 12'.

In some embodiments, a thinning-process is performed on the molding layer 16, the first semiconductor dies 12 and the second semiconductor die 13 by using a polish process or a grinding process, such as chemical mechanical polish (CMP) or any suitable processes.

In some embodiments, upper surfaces 15'T of the TSVs 15, upper surfaces 16'T of the thinned molding layer 16', upper surfaces 12'T of the thinned first semiconductor dies 12' and an upper surface 13'T of the thinned second semiconductor die 13' are coplanar as shown in FIG. 5.

Figure 6:
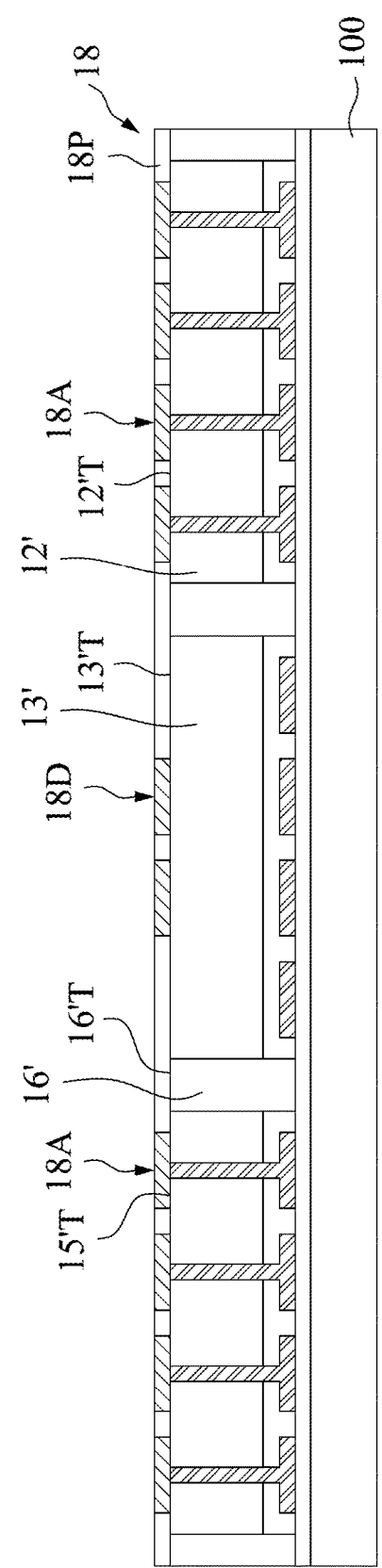

Referring to operation S108, as shown in FIG. 6, a bond-pad layer 18 is formed over the upper surfaces 16'T of the molding layer 16', the upper surfaces 12'T of the first semiconductor dies 12' and the upper surface 13'T of the second semiconductor die 13'.

In some embodiments, the bond-pad layer 18 includes active pads 18A and dummy pads 18D. Each of the active pads 18A is disposed on a corresponding one of the upper surfaces 15'T of TSVs 15 and dummy pads 18D are disposed on the second semiconductor die 13'. In some embodiments, the active pads 18A and dummy pads 18D are made of a metal such as aluminum (Al).

In some embodiments, the bond-pad layer 18 includes passivation material 18P for purpose of insulation. For example, the passivation material 18P is made of silicon oxide, silicon nitrides, polyimide (PI), polybenzoxazole (PBO), benzocyclobutene (BCB), epoxy, or other material having similar insulating and structural properties.

In some embodiments, the bond-pad layer 18 is formed using PVD, CVD, printing, lamination, spin coating, spray coating, sintering, or thermal oxidation. As an example, active pads 18A and dummy pads 18D are formed respectively on the first semiconductor die 12' and the second semiconductor die 13', thereafter the passivation material 18P is formed covering the pads 18A, 18D. Thereafter, a grinding process is used herein to expose the pads 18A, 18D from the passivation material 18P.

Figure 7:
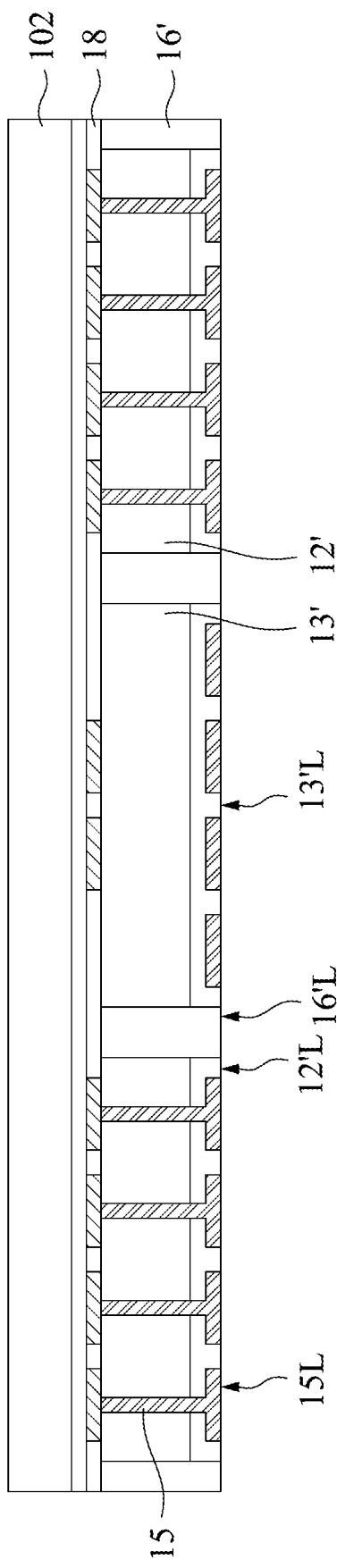

Referring to operation S110, as shown in FIG. 7, the first supporting substrate 100 is removed from lower surfaces 15L of the TSVs 15, lower surfaces 16'L of the molding layer 16', lower surfaces 12'L of the first semiconductor dies 12' and a lower surface 13'L of the second semiconductor die 13'. Specifically, a de-bonding process is performed to de-attach the first supporting substrate 100 from the molding layer 16' and the dies 12' and 13'. In some embodiments, laser, UV or heat is applied herein to activate de-bonding on a surface between the first supporting substrate 100 and the dies 12' and 13'.

In some embodiment, referring to FIG. 7, a second supporting substrate 102 is adhered to the bond-pad layer 18 before performing operation S110. More specifically, a bonding process is performed to adhere the second supporting substrate 102 onto the bond-pad layer 18; thereafter the first supporting substrate 100 is de-attached.

In some embodiments, the second supporting substrate 102 is made with silicon, glass, composite material with proper coefficient of thermal expansion (CTE), or other materials capable of supporting processing temperatures in excess of 200° C. the second supporting substrate 102 is a temporary and sacrificial supporting wafer substrate. In one embodiments, the second supporting substrate 102 is attached to the bond-pad layer 18 by a thermal-tape or UV-tape.

Figure 8:
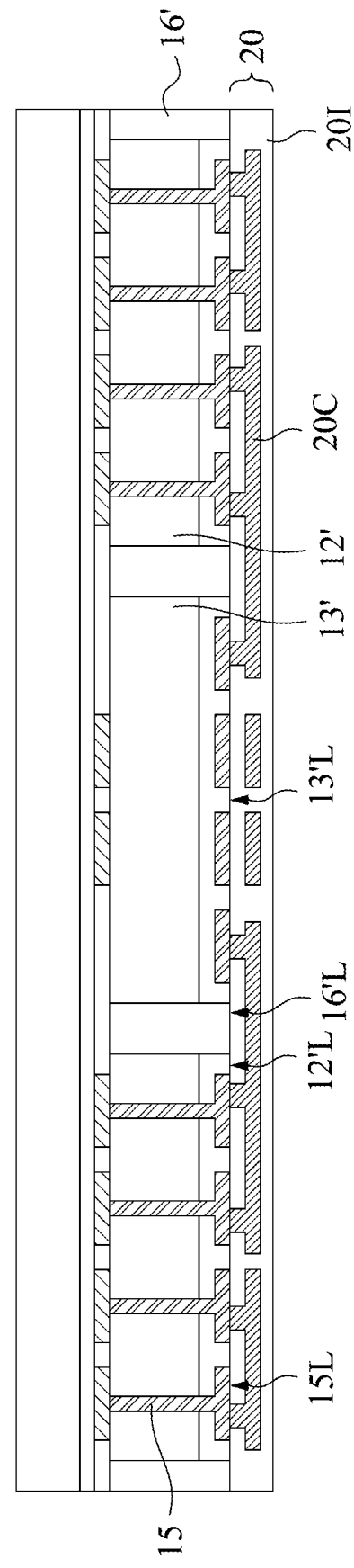

Referring to operation S112, as shown in FIG. 8, a plurality of redistribution layers 20 (RDLs) is formed underneath the lower surfaces 15L of the TSVs 15, the lower surfaces 16'L of the molding layer 16', the lower surfaces 12'L of the first semiconductor dies 12' and the lower surface 13'L of the second semiconductor die 13'.

The RDLs 20 is a single or multiple layer wafer level interconnect structure. The RDLs 20 may include one or more conductive layers 20C and insulation layers 20I, such as BCB redistribution layers (RDL), PI RDL, and PI/BCB passivation. The processing temperature used in forming RDLs 20 is typically greater than 200° C., but can be lower. The RDLs 20 provides a complete wafer level interconnect for the first semiconductor dies 12' and the second semiconductor die 13', in which more detail will be described below.

In some embodiments, as shown in FIG. 8, the RDLs 20 are electrically connected between each of the first semiconductor dies 12' and the second semiconductor die 13'. In other words, an electrical signal from each of the first semiconductor dies 12' can be transferred to the second semiconductor die 13' and vice versa. In some embodiments, the RDLs 20 are electrically connecting to the TSVs 15 as shown in FIG. 8.

Figure 9:
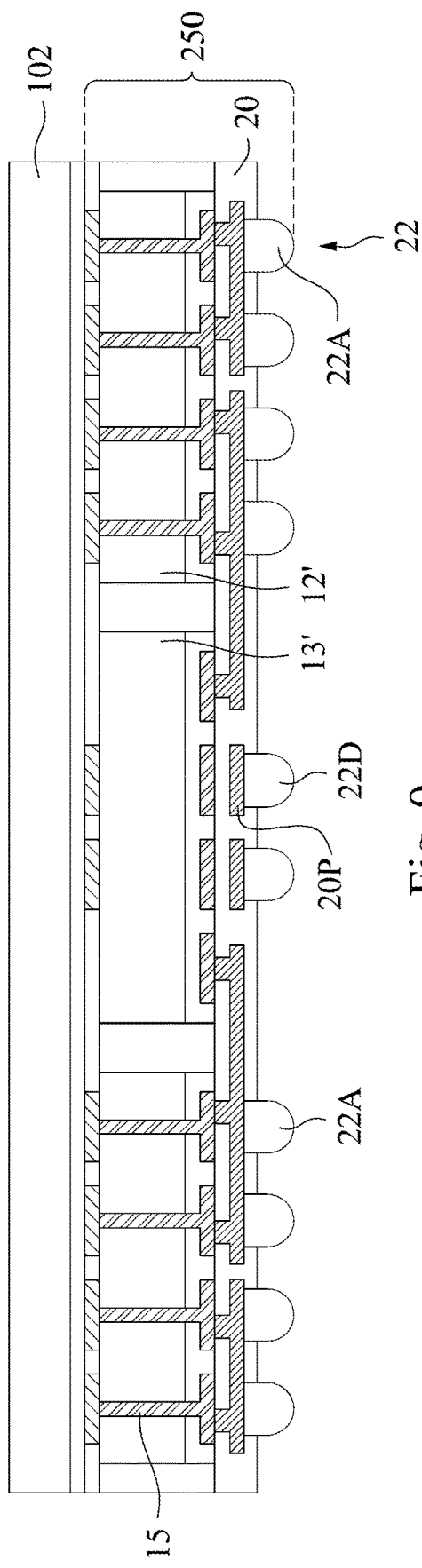

Referring to operation S114, as shown in FIG. 9, a plurality of bumps 22 are formed and connected to the RDLs 20. In some embodiments, the bumps 22 include active bumps 22A and dummy bumps 22D. The active pumps 22A are disposed below each of the first semiconductor dies 12' and dummy bumps 22D are disposed below the second semiconductor die 13'.

The bumps 22 are formed by a plating method. In some embodiments, the bumps 22 are made of ordinary solder, copper, nickel, gold, silver or equivalents thereof, but its material need not be limited to these.

As used herein, the term "dummy" refers to pads and bumps formed not for electrical interconnection, but for mechanical interconnection, and the term "active" refers to pads and bumps that provide electrical interconnection. Dummy bumps 22D and dummy pads 18D increase the reliability of the semiconductor package 500 as shown in FIG. 1 by increasing the mechanical bonding strength between the first semiconductor package 301 and the second semiconductor package 302. Thus, the interfacial delamination of surfaces between the first sub-package 301 and the second sub-package 302 can be mitigated.

In some embodiments, as shown in FIG. 9, the active bumps 22A are electrically connected to the TSVs 15 and the dummy bumps 22D are free of electrically connecting to the TSVs. In detail, the active bumps 22A are connected to the RDLs 20 and the RDLs 20 connected to TSVs 15; thereby the electrical connection between the active bumps 22A and the TSVs 15 is reached. Thus, an electrical signal from the first semiconductor dies 12' can be transferred to an external device via the electrically active bumps 22A. In the other hand, the dummy bumps 22D are connected to a part 20P of the RDLs 20 but the part 20P of the RDLs 20 are free of connecting to TSVs 15, thus the dummy bumps 22D are free of electrically connecting to the TSVs.

Figure 10:
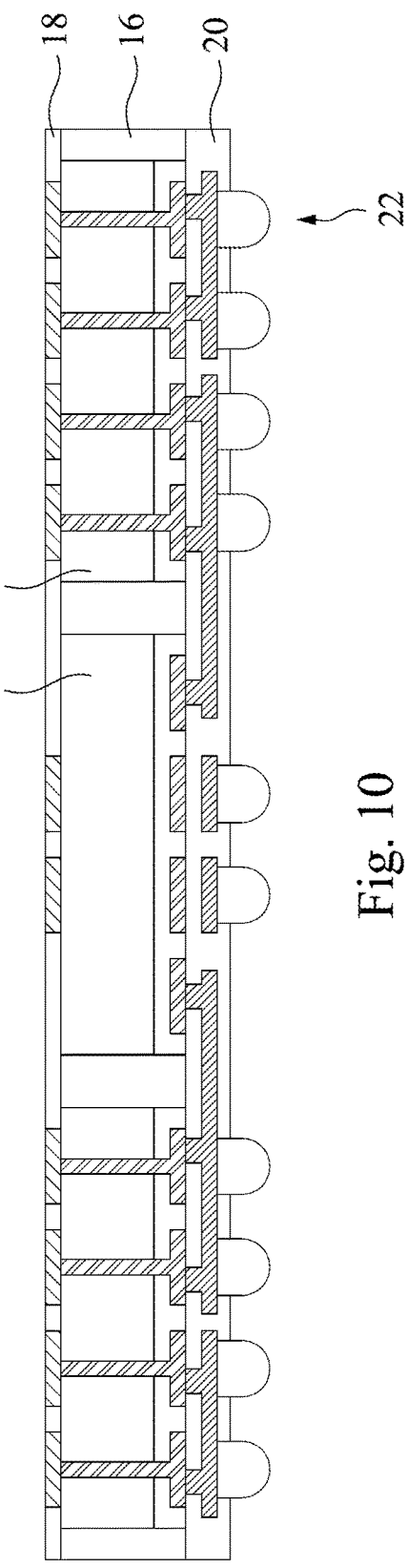

Referring to FIG. 10, the second supporting substrate 102 is removed from the bond-pad layer 18. The second supporting substrate 102 is de-attached from the bond-pad layer 18 by performing a de-bonding process as similar as the process conducted in operation 110.

Referring back to FIG. 9, after removing second supporting substrate 102 from the bond-pad layer 18, an assembly structure 250 is formed and thereafter is singulated into individual sub-package, that is, the first sub-package 301 or the second sub-package 302 as shown in FIG. 9. The sub-packages 301, 302 each includes the two first semiconductor dies 12' and the second semiconductor die 13' set in-between thereof, the molding layer 16, the bond-pad layer 18, the RDLs 20 and the bumps 22. As an example, a diamond wheel is used to cut the assembly structure 250 into individual sub-packages in the singulation process.

After forming the first sub-package 301 and the second sub-package 302 by using the sub-method M100 of FIG. 2 according to some embodiment of the present disclosure, the first sub-package 301 is stacked atop the second sub-package 302 by attaching the bumps 22 of the first sub-package 301 to the bond-pad layer 18 of the second sub-package 302; thereby a wafer level package 500 is formed as shown in FIG. 1.

Referring back to FIG. 1, a stacking-adhesive layer 30 is employed attaching the first sub-package 301 to the second sub-package 302 in some embodiments. In other embodiment, the stacking-adhesive layer 30 wraps each of the bumps 22 as shown in FIG. 1.

Although the drawings illustrate a wafer level stacked package 500 in which two packages 301, 302 are stacked with each other, the present invention is not limited to this. That is, three or more packages may be stacked with each other.

In some embodiments, when stacking the first sub-package 301 atop the second sub-package 302, each active bump 22A of the first sub-package 301 is attached to a corresponding one of the active pads 18A of the second sub-package 302 and each dummy bumps 22D of first sub-package 301 is attached to a corresponding one of the dummy pads 18D of the second sub-package 302 as shown FIG. 1.

By applying the dummy bumps 22D located between the first sub-package 301 and the second sub-package 302, the interface between the first sub-package 301 and the second sub-package 302 can be stabilized without suffering interfacial separation or delamination.

Figure 11:
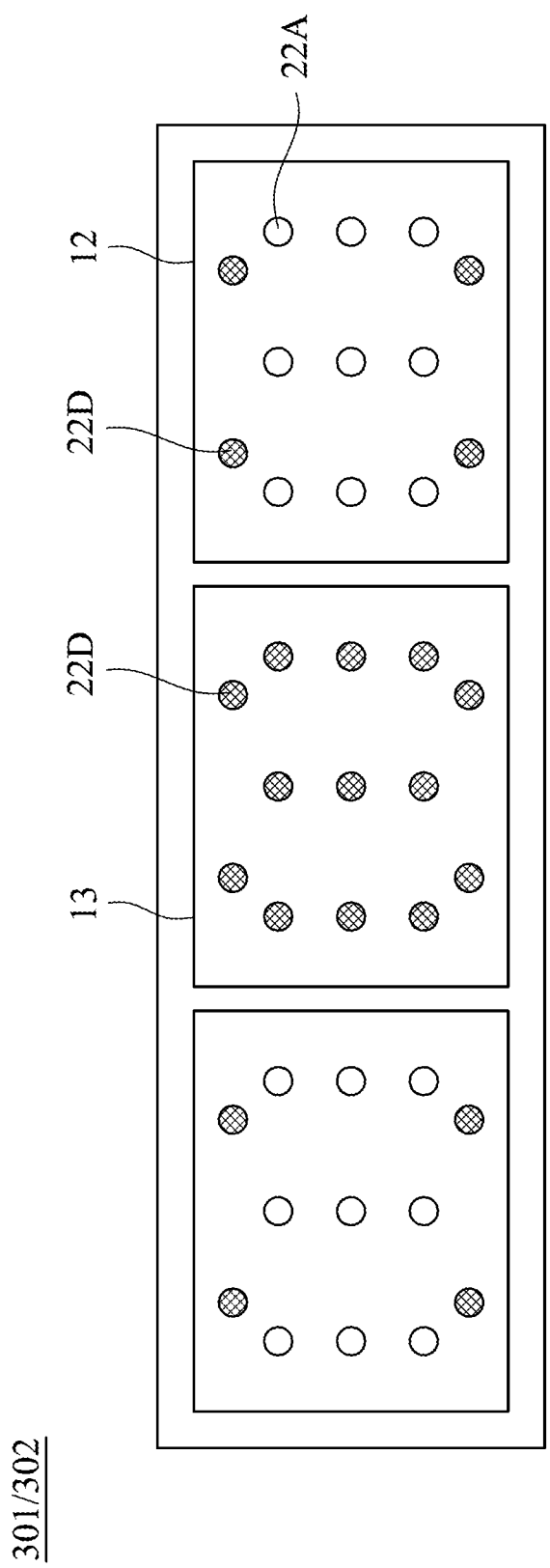
FIG. 11 illustrates a lay out of active bumps and dummy bumps on each of the first sub-package and the second sub-package according to some embodiments of the present invention.

FIG. 11 illustrates a lay out of active bumps 22A and dummy bumps 22D on each of the first sub-package 301 and the second sub-package 302 according to some embodiments of the present invention.

As shown in FIG. 11, from a top view, the dummy bumps 22D are disposed on the second semiconductor die 13 and the active bumps 22A are disposed on the first semiconductor die 12. In one embodiment, the dummy bumps 22D are disposed at corners of the second semiconductor die 13. In other embodiments, the dummy bumps 22D are disposed at center area of the second semiconductor die 13. In certain embodiment, the dummy bumps 22D are along the edges of the second semiconductor die 13.

In some embodiments, the dummy bumps 22D are disposed at corners of the first semiconductor die 12 from a top view as shown in FIG. 11.

A semiconductor package 500 is provided by the present disclosure according to some embodiments as shown in FIG. 1, the semiconductor package 500 includes a first sub-package 301 stacked atop a second sub-package 302, each of the first sub-package 301 and the second sub-package 302 are formed by using the method M100 in FIG. 1.

As shown in FIG. 1, the first sub-package 301 and the second sub-package 302 have a substantially the same structure. Briefly, each of the first and second sub-packages 301, 302 includes at least two first semiconductor dies 12 and a second semiconductor die 13 is disposed in between thereof. A plurality of molding pieces 40 are disposed between each of the first semiconductor dies 12 and the second semiconductor die 13.

Each of the first semiconductor dies 12 includes a plurality of through silicon vias 15 (TSVs). In some embodiments, upper surfaces 15T of the TSVs 15, upper surfaces 40T of the molding pieces 40, upper surfaces 12T of the first semiconductor dies 12 and an upper surface 13T of the second semiconductor die 13 are coplanar.

In some embodiments, a bond-pad layer 18 of each of the first sub-package 301 and the second sub-package 302 is disposed over the upper surfaces 15T of the TSVs 15, the upper surfaces 40T of the molding pieces 40, the upper surfaces 12T of the first semiconductor dies 12 and the upper surface 13T of the second semiconductor die 13.

In some embodiments, the bond-pad layer 18 includes active pads 18A and dummy pads 18D, each of the active pads 18A is disposed on a corresponding one of the upper surfaces 15T of TSVs and the dummy pads 18D are disposed on the second semiconductor die 13. In some embodiments, the bond-pad layer 18 includes passivation material 18P.

In some embodiments, a plurality of redistribution layers 20 (RDLs) are disposed underneath lower surfaces 15L of the TSVs, lower surfaces 40L of the molding pieces 40, lower surfaces 12L of the first semiconductor dies 12 and a lower surface 13L of the second semiconductor die 13. In some embodiments, the RDLs 20 of each of the first sub-package 301 and the second sub-package 302 are electrically connecting to the TSVs 15. In some embodiments, the RDLs 20 are electrically connected between the each of first semiconductor dies 12 and the second semiconductor die 13.

In some embodiments, a plurality of bumps 22 are connected to the RDLs 20. In some embodiments, the bumps 22 of each of the first sub-package 301 and the second sub-package 302 include active bumps 22A and dummy bumps 22D, the active bumps 22A are disposed below each of the first semiconductor dies 12 and the dummy bumps 22D are disposed below the second semiconductor die 13.

In some embodiments, the dummy bumps 22D are disposed at corners of the second semiconductor die 13 from a top view.

In some embodiments, the active bumps 22A of the first sub-package 301 are attached to a corresponding one of the active pads 18A of the second sub-package 302, and the dummy bumps 22D of the first sub-package 301 are attached to a corresponding one of the dummy pads 18D of the second sub-package 302. In some embodiments, the active bumps 22A are electrically connected to the TSVs and the dummy bumps 22D are free of electrically connecting to the TSVs.

In some embodiments, the bumps 22 of the first sub-package 301 are attached to the bond-pad layer 18 of the second sub-package 302.

The present invention achieves a semiconductor package with reduced interfacial delamination of surfaces in-between the sub-packages by applying dummy bumps and dummy pads disposed thereof.

Although the present invention has been disclosed in the above embodiments, it is not intended to limit the present invention. Any person skilled in the art can make various modifications and retouches without departing from the spirit and scope of the present invention. Therefore, the scope of protection of the present invention shall be determined by the scope of the attached patent application.

What is claimed is:

1. A semiconductor package, comprising:
a first sub-package stacked atop a second sub-package, each of the first sub-package and the second sub-package comprising:
   at least two first semiconductor dies and a second semiconductor die disposed in between thereof, wherein each of the first semiconductor dies comprises a plurality of through silicon vias (TSVs);
   a plurality of molding pieces disposed between each of the first semiconductor dies and the second semiconductor die, wherein upper surfaces of the TSVs, upper surfaces of the molding pieces, upper surfaces of the first semiconductor dies and an upper surface of the second semiconductor die are coplanar;
   a bond-pad layer disposed over the upper surfaces of the TSVs, the upper surfaces of the molding pieces, the upper surfaces of the first semiconductor dies and the upper surface of the second semiconductor die, wherein the bond-pad layer of each of the first sub-package and the second sub-package comprises active pads and dummy pads, each of the active pads is disposed on a corresponding one of the upper surfaces of the TSVs and the dummy pads are disposed on the second semiconductor die;
   a plurality of redistribution layers (RDLs) disposed underneath lower surfaces of the TSVs, lower surfaces of the molding pieces, lower surfaces of the first semiconductor dies and a lower surface of the second semiconductor die; and
   a plurality of bumps connecting to the RDLs,
wherein the bumps of the first sub-package are attached to the bond-pad layer of the second sub-package.

2. The semiconductor package of claim 1, wherein the bond-pad layer comprises passivation material.

3. The semiconductor package of claim 1, wherein the RDLs of each of the first sub-package and the second sub-package are electrically connecting to the TSVs.

4. The semiconductor package of claim 3, wherein the RDLs are electrically connected between the each of first semiconductor dies and the second semiconductor die.

5. The semiconductor package of claim 1, wherein the bumps of each of the first sub-package and the second sub-package comprise active bumps and dummy bumps, the active bumps are disposed below each of the first semiconductor dies and the dummy bumps are disposed below the second semiconductor die.

6. The semiconductor package of claim 5, wherein, from a top view, the dummy bumps are disposed at corners of the second semiconductor die.

7. The semiconductor package of claim 5, wherein the active bumps of the first sub-package are attached to a corresponding one of the active pads of the second sub-package, and the dummy bumps of the first sub-package are attached to a corresponding one of the dummy pads of the second sub-package.

8. The semiconductor package of claim 5, wherein the active bumps are electrically connected to the TSVs and the dummy bumps are free of electrically connecting to the TSVs.

9. The semiconductor package of claim 1, wherein the bumps of each of the first sub-package and the second sub-package comprise active bumps, first dummy bumps, and second dummy bumps, the active bumps and the first dummy bumps are disposed below the first semiconductor dies and the second dummy bumps are disposed below the second semiconductor die.

10. The semiconductor package of claim 9, wherein the active bumps are electrically connected to the TSVs, and both the first and the second dummy bumps are free of electrically connecting to the TSVs.

* * * * *